United States Patent [19]

Hine et al.

[11] Patent Number: 4,468,076

[45] Date of Patent: Aug. 28, 1984

[54] ARRAY PACKAGE CONNECTOR AND CONNECTOR TOOL

[75] Inventors: Jean P. Hine, San Carlos; Thomas H. McGaffigan, Orinda, both of Calif.

[73] Assignee: Raychem Corporation, Menlo Park, Calif.

[21] Appl. No.: 401,176

[22] Filed: Jul. 23, 1982

[51] Int. Cl.³ .................... H01R 13/20; H01R 13/635
[52] U.S. Cl. .................. 339/75 M; 174/DIG. 8; 339/17 CF; 339/30; 339/DIG. 1
[58] Field of Search .................. 339/30, 17 CF, 74 R, 339/75 R, 75 M, 75 MP, 174, DIG. 1; 174/DIG. 8

[56] References Cited

U.S. PATENT DOCUMENTS

| | | | |
|---|---|---|---|
| 3,012,882 | 12/1961 | Muldauer et al. | 148/402 |
| 3,174,851 | 3/1965 | Buehler et al. | 148/426 |
| 3,315,212 | 4/1967 | Peterson | 339/75 M |
| 3,727,173 | 4/1973 | Goldmann et al. | 339/DIG. 1 X |
| 3,740,839 | 6/1973 | Otte et al. | 339/30 X |
| 3,753,700 | 8/1973 | Harrison et al. | 420/459 X |
| 3,763,459 | 10/1973 | Millis | 339/75 M |
| 3,783,429 | 1/1974 | Otte | 337/393 |
| 3,832,603 | 8/1974 | Gray et al. | 339/DIG. 1 X |
| 3,861,030 | 1/1975 | Otte et al. | 339/30 X |
| 4,035,007 | 7/1977 | Harrison et al. | 29/447 X |
| 4,198,081 | 4/1980 | Harrison et al. | 29/447 X |
| 4,220,389 | 9/1980 | Schell | 339/74 R |
| 4,337,090 | 6/1982 | Harrison | 148/402 |
| 4,412,713 | 11/1983 | Nishikawa | 339/75 M |

FOREIGN PATENT DOCUMENTS

| | | | |
|---|---|---|---|
| 703649 | 10/1967 | Belgium. | |
| 50442 | 4/1982 | European Pat. Off. . | |
| 1439848 | 6/1976 | United Kingdom | 339/DIG. 1 |

OTHER PUBLICATIONS

"Fundamentals of Martensitic Reaction", Cohen et al., in *Treatises in Metallurgy*, Tien et al., eds., 1981.

Primary Examiner—Eugene F. Desmond
Assistant Examiner—Steven C. Bishop
Attorney, Agent, or Firm—James W. Peterson

[57] ABSTRACT

A connector is described for removable electrical connection of an array package having a plurality of pins. A first board having a plurality of openings formed therethrough and a second parallel board having a plurality of complementary contact elements extending into the openings are interconnected by a heat-recoverable metal motion transmitting means preferably in the form of a grid positioned between the boards. One end of the grid is connected to the first board and the other end of the grid is connected to the second board to move the boards relative to each other causing engagement between the contact elements and the pins of an array package that may be inserted into the openings.

13 Claims, 8 Drawing Figures

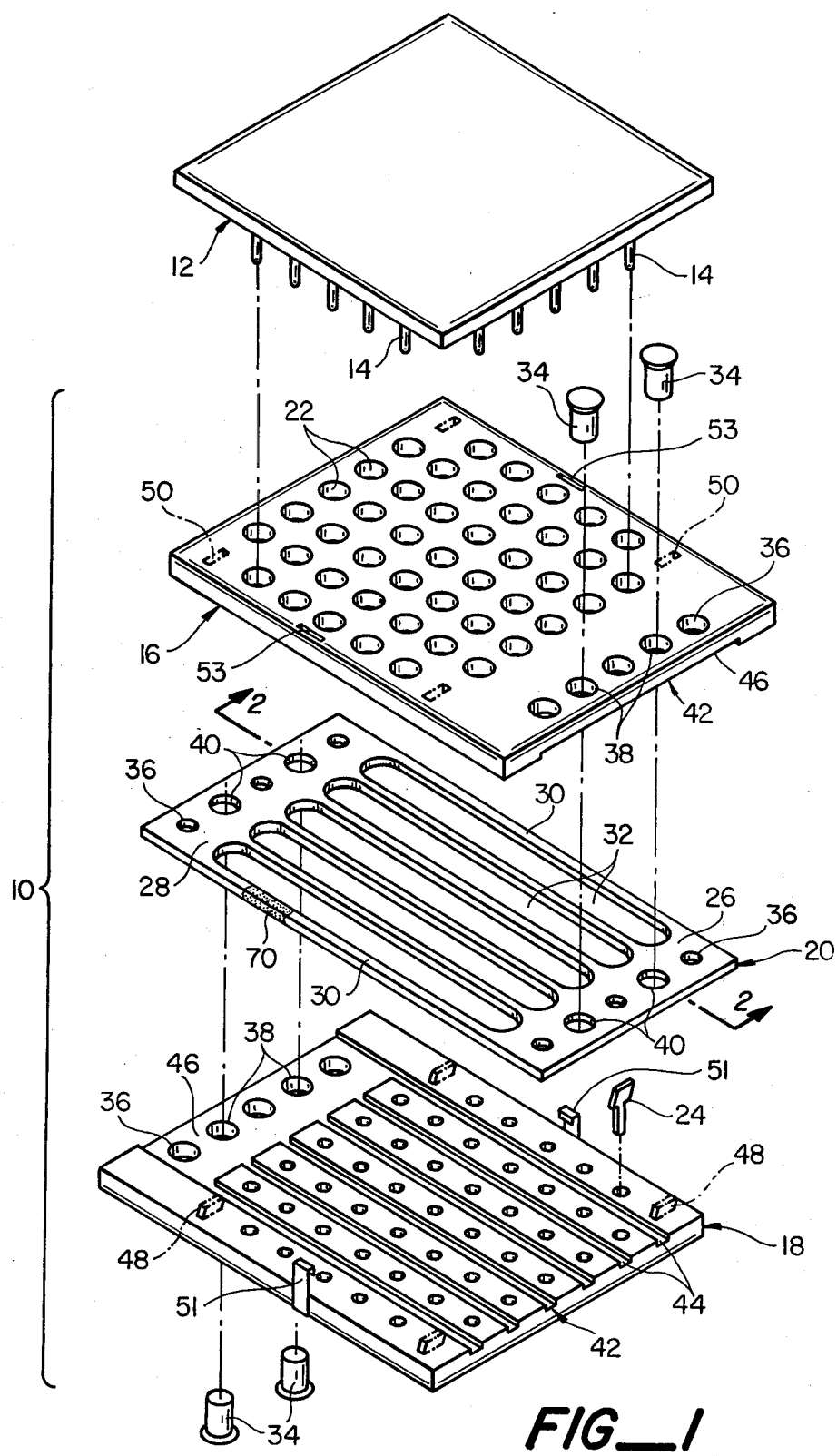
FIG__1

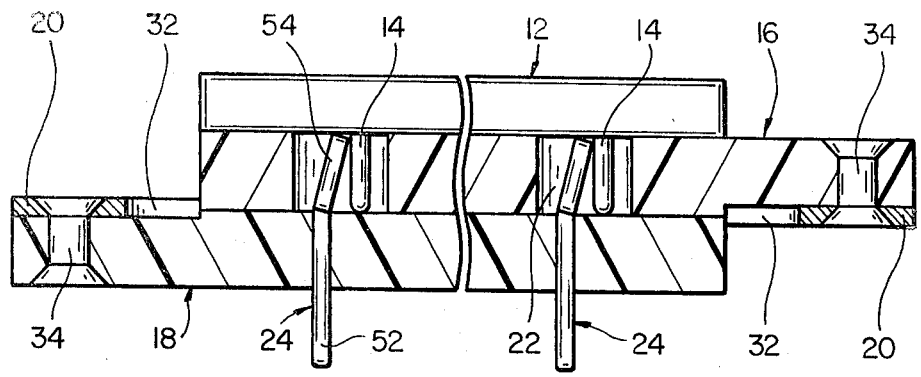
FIG_2
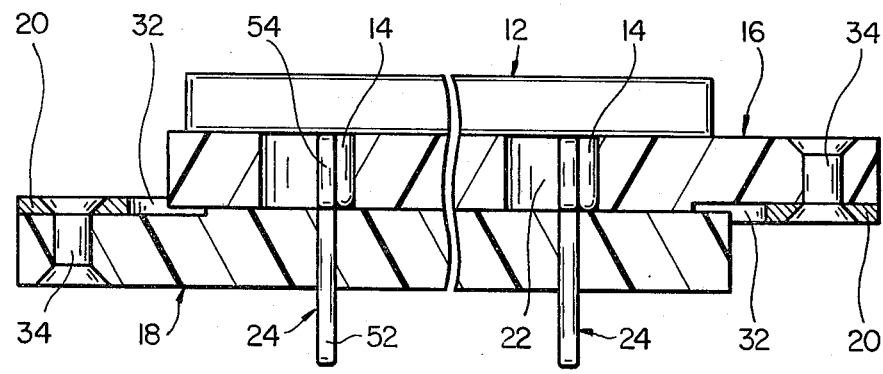
FIG_3
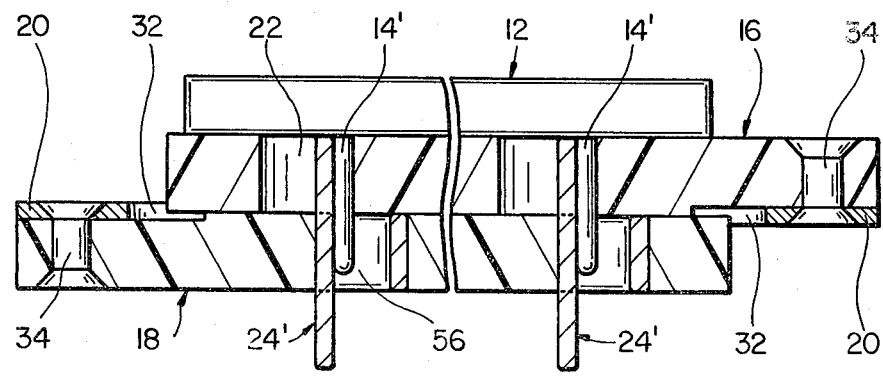
FIG_4

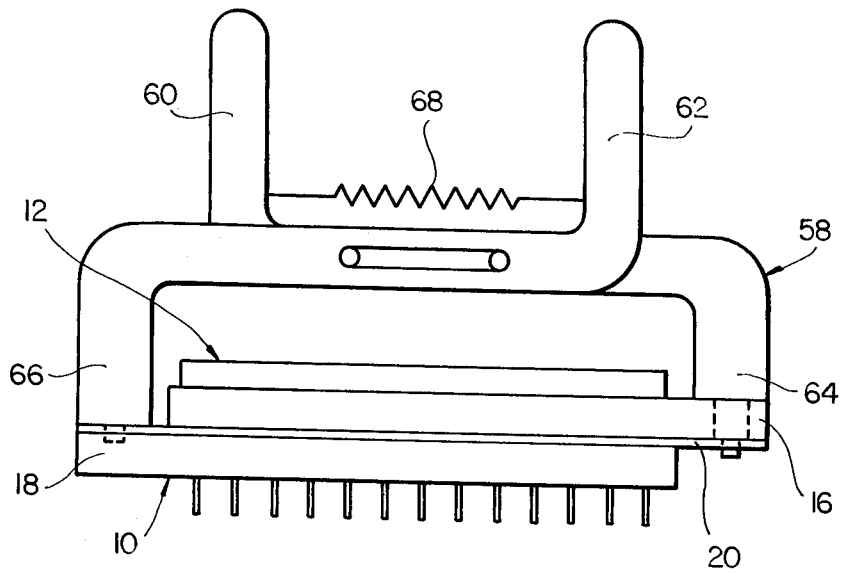
FIG_5
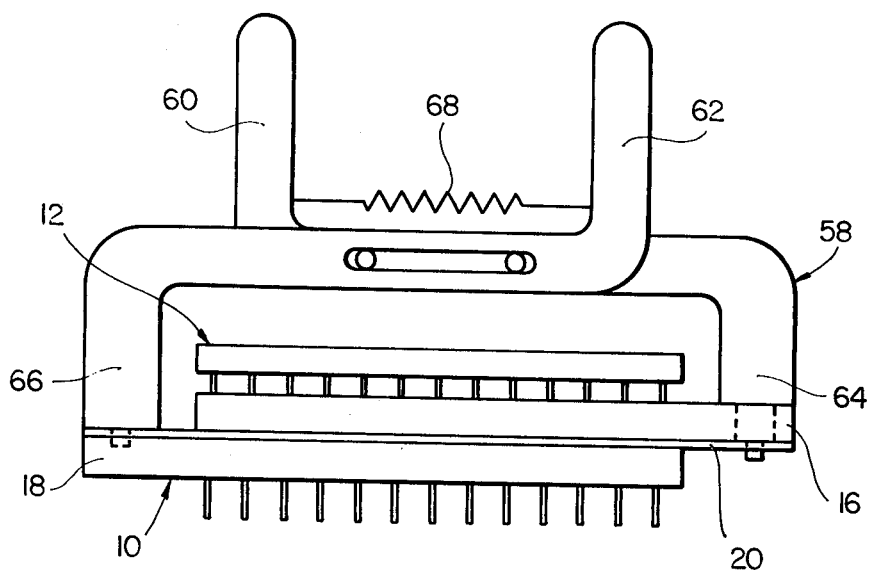
FIG_6

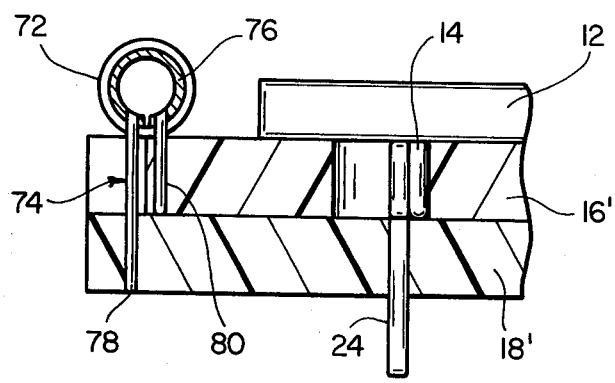
FIG_7
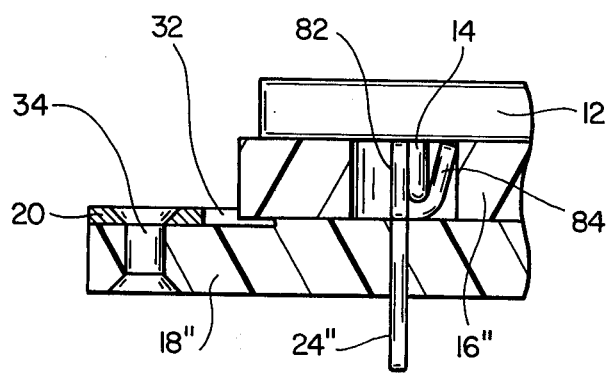
FIG_8

ARRAY PACKAGE CONNECTOR AND CONNECTOR TOOL

BACKGROUND OF THE INVENTION

Connection of semiconductor devices, such as integrated circuits, has become increasingly difficult as the number of pins on the device increases. An example of such a device is a pin grid array package (hereinafter PGAP) having a plurality of pins which plug into holes in a printed circuit board so that a reliable soldered connection can be made. Such solder connections provide good electrical contact and have good mechanical properties. However, a soldered connection is in essence a permanent connection and it is often difficult to remove such a package without damaging it or the board.

In order to provide a removable connection, it is commonly known to pre-attached a spring-loaded retaining socket to the circuit board and to rely on the spring characteristics of the socket to retain the components in place. As the number of pins in a package increases, the amount of force required to overcome the cumulative resistance of a corresponding number of sockets becomes so great that either the package and/or the circuit board becomes damaged.

U.S. Pat. No. 3,763,459 to Millis discloses a plug-in type socket for making temporary electrical connections with such packages without applying substantial insertion pressure. Millis discloses the mechanical actuation of a plurality of contact elements by a single actuating means. U.S. Pat. No. 3,315,212 to Peterson discloses a multi-pin connector assembly, including a cam-actuated movable connector block mounting flexible contacts. The mechanical retaining force of the above-mentioned devices is not always satisfactory particularly where the devices are exposed to shock or vibration. As a result, the Millis and Peterson type devices are limited to the temporary testing and evaluating of packages.

An extremely reliable contact which can be pre-soldered into a printed circuit board and which exerts a very strong retaining force on electrical components such as pins, after they are installed, is disclosed in commonly assigned U.S. Pat. No. 3,740,839. This patent discloses a resilient member such as a forked member fabricated from beryllium copper, having at least two tines capable of being moved inwardly, and when so moved, to exert an outward force on the means which is moving them inwardly. A band of heat-recoverable metallic material, for example, of a suitable alloy of titanium nickel, is placed around the exterior of the tines. When the metallic band is at a first temperature, it will be in its austenitic state, during which state it will have substantial strength and will attempt to assume a small diameter condition with the result that the tines will be pressed inwardly against any object inserted between them. Commonly assigned U.S. Pat. No. 3,861,030 utilizes a plurality of these individual contacts mounted with a plurality of tabs depending from an elongated carrier strip. It can be appreciated that as the number of contacts increase, the complexity and the cost of such a connector increases dramatically.

SUMMARY OF THE INVENTION

The purpose of the instant invention is to provide a connector for removably electrically connecting electrically conductive members, for example a plurality of closely spaced pins, said connector providing high retention force, low or zero insertion force and requiring at least one heat-recoverable metallic member to actuate the many pin contacts. To accomplish this purpose, this invention comprises a connector having two boards which are parallel to each other and a heat-recoverable metal motion transmitting means interconnecting the boards to move the boards relative to each other causing engagement between contact elements, located within the boards, and the pins of an array package.

One aspect of this invention comprises a connector comprising:
- a first board having a plurality of openings formed therethrough;
- a second board having a plurality of contact elements associated therewith, said second board being mounted parallel to said first board and said contact elements being complementary to said openings and extending into said openings; and
- a heat-recoverable metal motion transmitting means interconnecting said first and second boards to move said boards relative to each other, movement of said boards causing engagement between said contact elements and the pins of a multipin module that may be inserted into said openings.

A primary object of the instant invention is to provide a connector which is capable of forming a strong physical connection with the pins of a multipin module without applying the force in such a way that would bend or otherwise damage the pins.

Another object of the instant invention is to provide a connector which is extremely compact and has a minimum number of components.

Yet another object of the instant invention is to provide a low or zero-insertion force connector in which the contacts are compliant to allow for pin misalignment and for pin damage prevention.

It is still another object of the instant invention to provide a reusable connector.

Other and further objects, features and advantages of the invention will be apparent from the following more particular description of preferred embodiments of the invention as illustrated in the accompanying drawings.

BRIEF DESCRIPTION OF THE DRAWING

FIG. 1 is an exploded view of the unassembled connector of the instant invention with a pin grid array package positioned above the connector. An optional biasing means is also shown in phantom.

FIG. 2 is a cross-sectional view taken along section line 2—2 of FIG. 1 showing the package positioned within the assembled connector prior to engagement with the pins of the package.

FIG. 3 is a cross-sectional view corresponding to FIG. 2 after engagement.

FIG. 4 is a cross-sectional view similar to FIG. 3 of an alternative embodiment of the instant invention.

FIG. 5 is a side view of the connector and an installed package with a package removal tool initially placed in position but prior to operation of the tool.

FIG. 6 is a full-side view similar to FIG. 5 showing the package removal tool after operation with the package shown disengaged.

FIG. 7 is a partial cross-sectional view similar to FIG. 3 of an alternative embodiment of the instant invention having an alternative exterior mounted heat-recoverable metal motion transmitting means and biasing means.

FIG. 8 is an exploded partial perspective view of yet another alternative embodiment of the instant invention illustrating an individual self-biasing contact element.

DETAILED DESCRIPTION OF THE INVENTION

The connector of this invention comprises a compact assembly for releasably mounting a multipin module such as a pin grid array package wherein the device provides high retention force and low insertion force. The number of pins in such a package (usually more than one hundred) make interconnection impossible if the individual contacts in the connector have a high pressure contact force. Generally a compromise as to contact force is necessary thus destroying the utility of the device during vibration or after the package is exposed to ambient conditions such as high humidity or salt spray. Because the speed of the signals transmitted in such packages is high, no signal interruption larger than a nanosecond is acceptable. During environmental conditions such as high vibration, this requirement is difficult to achieve with conventional connector designs. The use of a heat-recoverable metal having two phases allows the design of a connector which may have low insertion force and yet have high retention force. The instant invention provides an optimized connector utilizing heat-recoverable metals for low insertion force and high retention force in an extremely compact package having a minimum number of moving parts.

The connector of this invention comprises two parallel movable boards, one having openings and the other containing contact elements for engaging pins wherein the boards are interconnected by a heat-recoverable metal motion transmitting means which moves the boards relative to each other to removably secure the pins. In the preferred embodiment, the heat-recoverable metal motion transmitting means comprises a grid of webs and slots which is sandwiched between the boards, one end of the grid connected to one board and the other end of the grid connected to the other board. In the simplest of embodiments, the low profile, injection moldable boards and the flat, machine stampable grid produce a compact and reliable connector having a minimum number of components for securely but removably connecting a multipin module.

The above-described connector is both physically and electrically compact. The connector has a low profile and a minimum plan surface area that facilitates high packing densities. The combined pin and contact length is at a minimum thus the length of the signal transmission path is short facilitating higher signal transmission speeds.

The conductor of this invention may be reopened by a separate tool which, in the preferred embodiment, simultaneously cools the heat-recoverable metal grid causing it to change metallurgical state while the tool expands the grid to release the multipin module.

In an alternate embodiment, a separate biasing means to bias the grid for disengagement may be made integral with one of the boards. In a further embodiment, a separate biasing means may be made integral with the individual contact elements contained within the board.

In another embodiment of the instant invention, the heat-recoverable metal motion means may be connected outboard of the two boards and may comprise a spring C-ring captured by a heat-recoverable ring, said ring acting as the heat-recoverable metal transmitting means to compress the C-ring and thus move one board relative to another for engagement. Upon change of metallurgical state, the spring force generated by the C-ring overcomes the heat-recoverable ring to disengage the pins of the multipin module.

The invention is more fully described with reference to the preferred and alternate embodiments illustrated in the accompanying drawing. It is to be understood that other embodiments are possible, as will be apparent to one skilled in the art.

FIG. 1 illustrates an exploded view of the connector of the instant invention referred to generally at 10. Positioned above connector 10 is a pin grid array package shown generally at 12 having a plurality of pins 14 extending therefrom. Pins 14 may be arrayed in various geometric configurations and may be of various cross sections. Connector 10 comprises a first board 16, a second board 18 and a heat-recoverable metal motion transmitting means in the form of a grid 20 positioned therebetween.

First board 16 contains a plurality of openings 22 formed therethrough which are complementary in number and array to pins 14 of the package 12. Second board 18 contains a plurality of contact elements shown typically by contact element 24 which are complementary in array and compatible in size to the openings 22 and which, when the connector is assembled (See FIGS. 2 and 3) extend into said openings 22. Contact elements 24 are designed to be compliant as to pins 14. The pins will be discussed later in FIG. 2. Openings 22 are sufficiently large so as to accommodate contact elements 24 and pins 14.

The preferred heat-recoverable metal motion transmitting means comprises a grid 20 having a first end 26 and a second end 28 and having webs 30 extending between said first and second ends 26 and 28, defining slots 32 between the webs 30. The grid is positioned between said first board 16 and said second board 18. The slots 32 are wider than the width of the openings 22 and contact elements 24 so as to be insulated from the contact elements 24 and the pins 14 that may be inserted into the openings 22. The first end 26 of the grid 20 is connected to the first board 16 and the second end 28 of the grid 20 is connected to the second board 18 by fastener means 34 shown generally as rivets. Other fastening means including the integral molding of the grid within the boards are within the scope of the invention.

Tool openings 36 are provided in the grid 20 and the first and second boards 16 and 18 as will be appreciated more clearly in the discussion of FIGS. 5 and 6. Fastener means 34 are preferably staggered with respect to tool openings 36 and extend through holes 38 in the boards 16 and 18, into holes 40 in the grid 20. It is within the scope of the invention that the fastener means act as a tool connection. For example, the fastener means 34 may comprise hollow rivets (not shown) into which the tool may be inserted. Such an arrangement allows uniform stress distribution within the grid 20 during expansion.

Boards 16 and 18 are preferably recessed to insulate and slidingly receive webs 30 of the grid 20. The recess area noted generally by 42 can be clearly seen with respect to second board 18. It is noted that the underside of first board 16 cannot be seen in FIG. 1, but it is understood that its recess area is identical to second board 18. Recess 42 in turn comprises channels 44 and open portion 46. Channels 44 accommodate webs 30 and open portions 46 accommodate first and second ends 26 and 28 of the grid 20.

FIG. 1 also illustrates in phantom the alternate resilient members 48 mounted to the upper surface of second board 18 and complementary interfaces 50 within the lower surface of first board 16. Resilient members 48 and complementary interfaces 50 define a separate biasing means which biases said first board 16 relative to said second board 18 to disengage pins 14 when the grid 20 no longer overcomes the forces created by the biasing means. It is understood that the resilient members 48 and complementary interfaces 50 are optional with respect to the preferred embodiment.

FIG. 1 alone illustrates retention clips 51 and complementary detents 53. The clips 51 connect the first and second boards 16 and 18 vertically yet allow translational movement of the boards relative to each other in the direction of grid expansion and recovery. Other functionally similar retention means such as integral molding of the boards with complementary sliding rails (not shown) are within the scope of the invention.

Heat-recoverable metal motion transmission means, whether in the form of the grid 20 shown in FIG. 1 or in other optional forms within the scope of the invention, are formed from heat-recoverable metal. Heat-recoverable metals are disclosed in U.S. Pat. No. 3,012,882 and U.S. Pat. No. 3,174,851, and Belgian Pat. No. 703,649, the disclosures of which are incorporated by reference herein to illuminate the background of the present invention. As made clear in these patents, these alloys undergo a transition between an austenitic state and a martensitic state at certain temperatures. When they are deformed while they are in the martensitic state, they will retain this deformation while maintained in this state, but will revert to their original configuration when they are heated to a temperature at which they transform to their austenitic state. This ability to recover upon warming has been utilized in commonly assigned U.S. Pat. Nos. 4,035,007 and 4,198,081, which are incorporated by reference herein. The temperatures at which these transitions occur are affected, of course, by the nature of the alloy. A group of alloys having a particularly useful transition temperature are disclosed in commonly assigned U.S. Pat. No. 3,753,700 and U.S. Pat. No. 4,337,090 which are also incorporated herein by reference. A heat-recoverable metal motion transmission means may be fabricated from a heat recoverable metal material, for example, the titanium nickel alloy disclosed in U.S. Pat. No. 3,753,700.

While heat-recoverable metals have been known for some time, their use in connecting devices has been limited by the relatively small percent deformation they exhibit when they are recovered. The amount of recovery is dependent upon the alloy used, as well as by the means in which it has been expanded or deformed. The recovery is typically limited to 6 to 8 percent of heat-recoverable strain. Furthermore, those alloys which exhibit the desired heat recoverability are not necessarily themselves excellent electrical conductors, nor do they necessarily exhibit the ability to be readily soldered. The grid 20 of FIG. 1, having long webs 30, provides a heat-recoverable metal motion transmitting means having more extension and more subsequent motion. Grid 20, particularly webs 30, are expanded to the overall dimension shown in FIG. 2. Grid 20 has recovered to its original smaller dimension as shown in FIG. 3. This recovery is facilitated by a change from one expanded metallurgical state to another metallurgical state, said cchange causing recovery and the movement of the first and second boards relative to each other. This in turn causes engagement between the contact elements 24 and the pins 14.

Where the heat-recoverable metal motion transmitting means is made from a shape-memory alloy having a martensitic state and an austenitic state, motion of the boards relative to each other is accomplished by expanding the grid 20 while it is in its martensitic state and then changing the material of the grid by a change in temperature to its austenitic state. The change in metallurgical state recovers the grid to its nonexpanded dimension. The first and second boards 16 and 18 thus move relative to each other, causing engagement between the contact elements 24 and the pins 14.

There are basically three ways to utilize the properties of a heat-recoverable metal in the connector of the instant invention.

The first way to obtain an expanded martensitic state is to cool the heat-recoverable metal motion transmitting means or grid 20 below its martensitic transformation temperature and then expand the grid dimensionally by mechanical means such as the tool 58 or a separate biasing means. Upon heating, the material will return to its original or nonexpanded austenitic state, overcoming if necessary the separate biasing means.

The second way to obtain an expanded martensitic state is to apply a stress alone. This will cause simultaneous expansion of the grid and transformation of the material from its austenitic state to an expanded martensitic state. This type of behavior of the material is often referred to as its pseudoelastic behavior. However, martensite can be produced by stress only over a limited temperature range above its martensitic transformation temperature. Upon release of the stress, the material will revert to its original nonexpanded dimension and austenitic state. The grid can be so stressed by use of the tool 58.

The third way to obtain an expanded martensitic state is to cool an appropriately trained grid below its martensitic transformation temperature. Some heat-recoverable alloys after repeated cycling by either of the first two methods above become "trained." An external mechanical means for expansion is no longer required and the "trained" grid will spontaneously expand with cooling alone. Such a phenomena is discussed in *Treatises in Metallurgy* edited by J. F. Tien and J. F. Elliott, 1981, in the chapter titled "Fundamentals of Martensitic Reaction" by M. Cohen and C. M. Wayman. This chapter is incorporated herein by reference. This behavior of the material is often referred to as its "two way" shape memory effect.

Selection of one of the above means will be determined by the specific properties of the alloys and the connector operating conditions.

FIG. 2 shows in full section view, the connector of FIG. 1, with the package 12 inserted therein prior to recovery of the expanded grid 20. It can be seen that the pins 14 of the package 12 extend into the openings 22 without interference with the contact elements 24. No interference means low or zero resulting insertion force. Contact elements 24 are compliant by nature of their shape or material composition. Specifically, contact elements 24 are shown generally to have a straight section 52 and an inclined section 54. Straight section 52 is associated with second board 18 and inclined section 54 extends into openings 22. The lower portion of straight section 52 is utilized to permanently interconnect the connector with associated electronics (not shown). Inclined section 54, as can be clearly seen in comparing FIGS. 2 and 3, is compliant in that it will move or straighten when engaging pins 14 of the package 12 upon recovery of the grid 20. Compliant contact elements are important to the instant invention in that the contact elements will elastically deform to accommodate dimensional variations in both the package 12 and the connector 10 thus not damaging the pins 14. Such damage could destroy the removability of the package 12. Other compliant contact element configurations would be obvious to one having ordinary skill in the art and are considered to be within the scope of the invention. It is also understood that other contact element designs which may be attached to either board 16 or board 18 are within the scope of the invention.

FIG. 3 illlustrates the connector of FIG. 2 with the grid 20 in its recovered state. It can be seen that the inclined section 54 of conact element 24 has been engaged with pin 14 and that it has straightened generally into alignment with straight section 52. With grid 20 recovered, the connector provides high retention force on package 12.

FIG. 4 illustrates an alternate embodiment of the connector shown in FIGS. 1 through 3. Specifically, FIG. 4 illustrates a second board 18 which will accommodate a package 12 having an elongated pin 14'. Board 18 is provided with additional pin openings 56 complementary to the openings in said first board 16 into which the elongated pins 14' may be inserted.

Contact elements 24 are shown to be associated with the second board 18 but it is understood that the attachment of the contact elements 24 to either board is within the scope of the invention.

FIGS. 5 and 6 illustrate the operation of a removal tool shown generally at 58. Tool 58 comprises first and second members 60 and 62, respectively, having connector contact portions 64 and 66, respectively, which thermally and mechanically contact the connector 10 to facilitate release of a package 12 after it has been installed and the grid 20 has been recovered. Tool 58 also includes an expansible biasing means 68 shown in the form of a spring in tension interconnecting members 60 and 62. In FIG. 5, grid 20 is shown to be recovered and package 12 has been securely engaged within the connector 10 by relative movement of boards 16 and 18. In the preferred embodiment, grid 20 has previously gone from its martensitic state to its austenitic state and has moved the first and second boards relative to each other. In the austenitic state, the heat recoverable metal effects high retention force engagement. In this instance, if the grid is returned from its austenitic state to its martensitic state, the grid 20 will lose tensile strength but will not, on its own accord, change in dimension. Thus, external means in the form of a tool 58 or some optional portion of the connector 10 such as the resilient members 48 and complementary interfaces 50 must be utilized to disengage or open the connector 10. It is understood that a grid 20 made from a "trained" heat-recoverable metal will expand to disengage by cooling alone.

For purposes of discussion, the alloy utilized in the grid 20 is one which is in its martensitic state when relatively cold and which changes to its austenitic state when warmed. In this instance, removal of the package 12 is accomplished by applying tool 58 which is cold and which through thermal conduction through portions 64 and 66 will cool grid 20 causing grid 20 to go from its austenitic state to its relaxed martensitic state. Optional grid cooling fins (not shown) may be provided. The cooling fins would extend vertically, upwardly to make further contact with portions 64 and 66. The purpose of fins would be to enhance conductive cooling of the grid 20. Biasing means 68 of tool 58 automatically moves the members 60 and 62 relative to each other to expand the grid 20 that has been cooled by portions 64 and 66. With grid 20 expanded, package 12 may be inserted or removed as can be seen in FIG. 6.

The same biasing function accomplished by the tool 58 may be incorporated into the connector 10 by the use of the resilient members 48 and complementary interfaces 50. Such resilient members operate as a separate biasing means to disengage the pins of the package when the alloy of the grid 20 is cooled by some external means (not shown) such as liquid nitrogen. In either instance, whether an external tool tool is utilized or where integral biasing means are provided, improved thermal isulation and movement of the grid 20 is enhanced by the utilization of a coating 70. The coating 70 on webs 30 may be seen in FIG. 1. Such a coating 70 insulates the webs 30 to reduce heat transfer to the boards, thus improving heat transfer through end portions 26 and 28. The coating also decreases friction between the grid 20 and the first and second boards 16 and 18. A coating of a fluoropolymer material is preferred.

FIG. 7 illustrates yet another embodiment of the instant invention wherein the heat-recoverable metal transmitting means comprises a heat-recoverable metal ring 72 which completely encircles yet another biasing means in the form of a spring C-ring assembly noted generally at 74. FIG. 7 is a cross-sectional or end view of this embodiment. It is understood that spring C-ring assembly 74 extends substantially across the width of a first board 16' and that more than one heat-recoverable metal ring 72 may be provided along the axial length of the spring C-ring assembly 74. Spring C-ring assembly 74 comprises a generally cylindrical spring body portion 76, extending transversely across the surface of first board 16', and depending pegs 78 and 80 which are attached to boards 16' and 18'. Peg 80 is secured to first board 16' and peg 78 is secured to second board 18' through an oversized opening in first board 16'. The use of a plurality of pegs 78 and 80 extending transversely across the surfaces of the boards is obviously within the scope of the invention.

The heat-recoverable metal ring 72 is shown in its recovered or austenitic state, wherein it has compressed or squeezed spring C-ring assembly 74 to move first board 16' relative to second board 18' to force pins 14 into secure engagment with contact member 24. If the heat-recoverable metal ring 72 was, as described with respect to the other embodiments, cooled so to return to its weakened or martensitic state, then the spring force exerted by spring C-ring assembly 74 and as transmitted by pegs 78 and 80 would overcome the compressive forces of heat-recoverable metal ring 72, radially expanding the heat-recoverable metal ring 72, moving the boards relative to each other and disengaging or opening the connector.

FIG. 8 shows still another alternate embodiment wherein forked contacts 24' having tines 82 and 84 are utilized to both engage the pins 14 of a package 12 and bias boards 16" and 18". Inclined tine 84 is shown in contact with board 16" to bias the board 16" relative to the board 18". The connector is shown in the open condition where the grid 20′ has been expanded while in its weakened martensitic state. Grid 20′ when warmed, recovers, overcoming the biasing of tine 84 causing the capture of pin 14 between itself and tine 82.

While the invention has been particularly shown and described with reference to the peferred embodiments thereof, it will be understood by those skilled in the art that the foregoing and other changes in form and details may be made therein without departing from the spirit and scope of the invention, limited only by a just interpretation of the following claims.

What is claimed is:

1. A connector comprising:
   a first board having a plurality of openings formed therethrough;
   a second board having a plurality of contact elements associated therewith, said second board being mounted parallel to said first board and said contact elements being complementary to said openings and extending into said openings; and
   a heat-recoverable metal motion transmitting means interconnecting said first and second boards to move said boards relative to each other, movement of said boards causing engagement between said contact elements and the pins of a multipin module that may be inserted into said openings.

2. A connector, as in claim 1, wherein said heat-recoverable metal motion transmitting means is disposed between said first and second boards.

3. A connector as in claim 2 wherein said heat-recoverable metal motion transmitting means comprises a grid having first and second ends and having webs of material extending between said first and second ends defining at least one slot between said webs, said contact elements being positioned within said slot, the first end of said grid connected to said first board to the second end of said grid connected to said second board.

4. A connector as in claim 3, wherein said slot is wider than the width of said openings and the contact elements so as to be insulated from the contact elements and pins that may be inserted into said openings.

5. A connector as in claims 1 or 4 wherein said heat-recoverable metal transmitting means is made from a heat-recoverable metal having a martensitic state and austenitic state, said means being expanded dimensionally while in its martensitic state to allow insertion of pins of a multipin module, a change from its martensitic state to its austenitic state recovering said means to its non-expanded dimension thus moving the boards relative to each other causing engagement with the pins of a multipin module.

6. A device as in claim 5 wherein said first and second boards are provided with separate biasing means to bias said first board relative to said second board to disengage pins that may be inserted into said openings when said heat-recoverable metal goes from its austenitic state to its martensitic state.

7. A connector as in claim 5 wherein the contact elements bias said first board relative to said second board to disengage pins that may be inserted into said openings when said heat recoverable metal goes from its austenitic state to its martensitic state.

8. A connector as in claims 3 or 4 wherein said webs are coated with thermally insulating material to thermally insulate said webs and to decrease friction between the boards.

9. A connector as in claims 1 or 4 wherein said second board contains a plurality of pin openings complementary to the openings in said first board to allow pins of a multipin module that may be inserted into said openings of said first board to be further inserted into said pin openings of the second board.

10. A connector as in claim 5 wherein said heat-recoverable metal transmitting means is made from a trained heat-recoverable metal which will reversably transform from its recovered austenitic state to its expanded martensitic state upon change in temperature.

11. A connector as in claim 1 wherein the heat-recoverable metal motion transmitting means is mounted external to said boards.

12. A connector as in claim 11 wherein said first and second boards are provided with a separate biasing means to bias said first board relative to said second board to disengage pins that may be inserted into said openings.

13. A tool for a connector having an element of heat-recoverable metal, said metal requiring cooling and expansion to operate the connector, the tool comprising:
    first and second members adapted to thermally and mechanically engage a heat-recoverable metal element of a connector, said members capable of being cooled; and
    an expansible biasing means interconnecting said members, said members cooling such an element upon engagement and said biasing means expanding to move the members apart from each other to expand such an element when it is cooled.

* * * * *

UNITED STATES PATENT AND TRADEMARK OFFICE
CERTIFICATE OF CORRECTION

PATENT NO.   :   4,468,076
DATED        :   August 28, 1984
INVENTOR(S)  :   Jean P. Hine and Thomas H. McGaffigan It is certified that error appears in the above-identified patent and that said Letters Patent are hereby corrected as shown below:

Col. 6, line 1, delete "cchange" and insert --change--;
Col. 7, line 19, delete "conact" and insert contact--;
Col. 8, line 18, delete "tool" (second occurrence);
Col. 8, line 20, delete "isulation" and insert --insulation--; and
Col. 9, line 6, delete "peferred" and insert --preferred--.

In claim 3, Col. 9, line 36, delete "to" (second occurrence) and insert --and--.

In claim 6, Col. 10, line 3, delete "device" and insert --connector--.

Signed and Sealed this

Sixteenth Day of July 1985

[SEAL]

Attest:

DONALD J. QUIGG

Attesting Officer       Acting Commissioner of Patents and Trademarks